(12) United States Patent
Xu et al.

(10) Patent No.: US 11,702,741 B2
(45) Date of Patent: Jul. 18, 2023

(54) PRODUCING POLYCRYSTALLINE DIAMOND COMPACT CUTTERS WITH COATINGS

(71) Applicant: Saudi Arabian Oil Company, Dhahran (SA)

(72) Inventors: Jianhui Xu, Dhahran (SA); Guodong Zhan, Dhahran (SA); Abdulwahab Al-Johar, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 17/549,290

(22) Filed: Dec. 13, 2021

(65) Prior Publication Data

US 2023/0183862 A1 Jun. 15, 2023

(51) Int. Cl.
*C23C 16/27* (2006.01)
*C23C 16/455* (2006.01)
*B23B 27/14* (2006.01)
*C23C 28/04* (2006.01)
*C23C 24/08* (2006.01)

(52) U.S. Cl.
CPC ........ *C23C 16/45525* (2013.01); *B23B 27/14* (2013.01); *C23C 24/08* (2013.01); *C23C 28/044* (2013.01); *B23B 2226/315* (2013.01)

(58) Field of Classification Search
CPC . C23C 16/27; C23C 16/279; C23C 16/45525; C23C 16/305; C23C 16/34; C23C 16/40
See application file for complete search history.

(56) References Cited

U.S. PATENT DOCUMENTS

| | | | |
|---|---|---|---|
| 5,833,021 A | 11/1998 | Mensa-Wilmot et al. |
| 8,071,173 B1 | 12/2011 | Sani |
| 8,734,552 B1 | 5/2014 | Vail et al. |
| 8,931,582 B2 | 1/2015 | Cooley et al. |
| 9,482,056 B2 | 11/2016 | Eyre et al. |
| 9,683,410 B2 | 6/2017 | Zhang et al. |

(Continued)

FOREIGN PATENT DOCUMENTS

| | | | | |
|---|---|---|---|---|
| CA | 2603458 C | * | 3/2008 | ........... C04B 35/645 |
| DE | 4126852 A1 | * | 2/1993 | ............. C23C 16/40 |

(Continued)

OTHER PUBLICATIONS

Zhao, Guolong, et al., "Fabrication and performance of CVD diamond cutting tool in micro milling of oxygen-free copper". Diamond & Related Materials 100 (2019) 107589, pp. 1-10.*

(Continued)

*Primary Examiner* — Bret P Chen
(74) *Attorney, Agent, or Firm* — Fish & Richardson P.C.

(57) ABSTRACT

A polycrystalline diamond is formed on a substrate to form a polycrystalline diamond compact (PDC) cutter for a tool. The polycrystalline diamond has a cross-sectional dimension of at least 4 millimeters. The substrate includes tungsten carbide. An outer surface of the PDC cutter is at least partially surrounded with at least a single layer of coating by atomic layer deposition. The single layer of coating is configured to protect the PDC cutter from thermal degradation in response to exposure to a temperature greater than 700 degrees Celsius (° C.) and less than about 1050° C.

20 Claims, 8 Drawing Sheets

(56) References Cited

U.S. PATENT DOCUMENTS

| 10,704,334 | B2 | 7/2020 | Jiang | |
|---|---|---|---|---|
| 2012/0055717 | A1* | 3/2012 | Liversage | C04B 41/88 175/428 |
| 2016/0312541 | A1* | 10/2016 | Feehily | C23F 1/02 |
| 2018/0202234 | A1 | 7/2018 | Saini et al. | |

FOREIGN PATENT DOCUMENTS

| JP | 61-87870 | * | 5/1986 | C23C 16/26 |
|---|---|---|---|---|
| JP | 8-25112 | * | 1/1996 | B23B 27/14 |
| WO | WO 2010111578 | | 9/2010 | |
| WO | WO 2014088569 | | 6/2014 | |

OTHER PUBLICATIONS

Lu, F., et al., "Research on preparation of HFCVD diamond coated milling cutter and stone cutting performance". IOP Conf. Series: Materials Science and Engineering 399 (2018) 012036, pp. 1-4.*

Reineck, I., et al., "Diamond Coated Cutting Tools". International Journal of Refractory Metals and Hard Materials 14 (1996) 187-193.*

Crystallume article: "Basics of CVD Diamond-Coated Cutting Tools" by Ed Francis and Chris Engdahl. Feb. 2017, pp. 1-5.*

Miess, D., et al., "Fracture toughness and thermal resistance of polycrystalline diamond compacts". Materials Science and Engineering A209 (1996) 270-276.*

Sha, Xiaohua, et al., "Thermal stability of polycrystalline diamond compact sintered with boron-coated diamond particles". Diamond & Related Materials 104 (2020 107753, pp. 1-11.*

Jaggernauth, Aneeta, et al., "Atomic layer deposition of high-k layers on polycrystalline diamond for MOS devices: a review". Journal of Materials Chemistry C, 2020, 8, 13127-13153.*

Lin, Tze-Pin, et al., "Residual Stresses in Polycrystalline Diamond Compacts". Journal of the American Ceramic Society 77(6) 1562-1568 (1994).*

Cardenas, Robert Lee, "Protected Polycrystalline Diamond Compact Bits For Hard Rock Drilling". DOE report-99049-1381, United States: N. p., Oct. 2000, pp. 1-79.*

U.S. Appl. No. 17/336,637, Zhan et al., filed Jun. 2, 2021.

U.S. Appl. No. 17/567,531, Zhan et al., filed Jan. 3, 2022.

Aghaei, "Atomic Layer Deposition: An Overview Al 2 O 3 ALD on Carbon Nanotubes and Graphene Surfaces," Chem. Rev., 2010, 110:111-131, 22 pages.

Fabreguette et al., "Ultrahigh x-ray reflectivity from W/Al2O3 multilayers fabricated using atomic layer deposition," Appl. Phys. Lett., 2006, 88, 013116, 3 pages.

\* cited by examiner

PRODUCING POLYCRYSTALLINE DIAMOND COMPACT CUTTERS WITH COATINGS

TECHNICAL FIELD

This disclosure relates to production of polycrystalline diamond compact (PDC) cutters and, particularly, PDC cutters with coatings for use in the oil and gas industry.

BACKGROUND

Drilling hard, abrasive, and interbedded formations poses a difficult challenge for conventional PDC drill bits. Historically, a conventional polycrystalline diamond material, generally forming a cutting layer, also called diamond table, dulls quickly due to abrasive wear, impact damage, and thermal fatigue. Thus, hardness, fracture toughness, and thermal stability of polycrystalline diamond materials represent three limiting factors for an effective PDC drill bit.

SUMMARY

Certain aspects of the subject matter described can be implemented as a method. A polycrystalline diamond layer is formed on a substrate to form a polycrystalline diamond compact (PDC) cutter for a tool. The polycrystalline diamond has a cross-sectional dimension of at least 4 millimeters. The substrate includes tungsten carbide. An outer surface of the PDC cutter is at least partially surrounded with a single layer of coating by atomic layer deposition. The single layer of coating is configured to protect the PDC cutter from thermal degradation in response to exposure to a temperature greater than 700 degrees Celsius (° C.) and less than about 1050° C.

This, and other aspects, can include one or more of the following features. Forming the polycrystalline diamond layer on the substrate can include placing a powder on the substrate by high pressure, high temperature (HPHT) hot pressing. The powder can include at least one of polycrystalline diamond powder or graphite powder. For example, the powder can include polycrystalline diamond powder, graphite powder, or both polycrystalline diamond powder and graphite powder. In some implementations, the powder has a particle size within a range of from about 0.1 micrometers (μm) to about 50 μm. Forming the polycrystalline diamond layer on the substrate can include sintering the powder into the substrate, which is a rigid substrate material, while also bonding the polycrystalline diamond layer to the rigid substrate material. In some implementations, the substrate includes a WC-Co powder having a Co content within a range of from about 1% to about 20% by weight. In some implementations, the WC-Co powder has an average particle size within a range of from about 1 nanometer (nm) to about 50 μm. At least partially surrounding the outer surface of the PDC cutter with the single layer of coating by atomic layer deposition can include depositing the single layer of coating on top of at least a portion of the outer surface of the PDC cutter by atomic layer deposition performed at a temperature in a range of from about 200° C. to about 400° C. In some implementations, the single layer of coating has a thickness in a range of from 1 nm to 100 nm. The entire outer surface of the PDC cutter can be completely encapsulated by the single layer of coating. In some implementations, the single layer of coating includes aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

Certain aspects of the subject matter described can be implemented as a method. A polycrystalline diamond layer is formed on a substrate to form a polycrystalline diamond compact (PDC) cutter for a tool. The polycrystalline diamond has a cross-sectional dimension of at least 4 millimeters. The substrate includes tungsten carbide. An outer surface of the PDC cutter is at least partially surrounded with multiple layers of coating by atomic layer deposition. The multiple layers of coating are configured to protect the PDC cutter from thermal degradation in response to exposure to a temperature greater than 700 degrees Celsius (° C.) and less than about 1050° C.

This, and other aspects, can include one or more of the following features. Forming the polycrystalline diamond layer on the substrate can include placing a powder on the substrate by HPHT hot pressing. The powder can include at least one of polycrystalline diamond powder or graphite powder. For example, the powder can include polycrystalline diamond powder, graphite powder, or both polycrystalline diamond powder and graphite powder. In some implementations, the powder has a particle size within a range of from about 0.1 micrometers (μm) to about 50 μm. Forming the polycrystalline diamond layer on the substrate can include sintering the powder into the substrate, which is a rigid substrate material, while also bonding the polycrystalline diamond layer to the rigid substrate material. In some implementations, the substrate includes a WC-Co powder having a Co content within a range of from about 1% to about 20% by weight. In some implementations, the WC-Co powder has an average particle size within a range of from about 1 nanometer (nm) to about 50 μm. At least partially surrounding the outer surface of the PDC cutter with the multiple layers of coating by atomic layer deposition can include depositing the multiple layers of coating on top of at least a portion of the outer surface of the PDC cutter by atomic layer deposition performed at a temperature in a range of from about 200° C. to about 400° C. Each of the layers of coating can be deposited layer by layer via atomic layer deposition. In some implementations, the multiple layers of coating have an overall thickness in a range of from 1 nm to 100 nm. In some implementations, each layer of the multiple layers of coating has a thickness in a range of from 1 nm to 100 nm. The entire outer surface of the PDC cutter can be completely encapsulated by the multiple layers of coating. Each layer of the multiple layers of coating can include at least one of aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

Certain aspects of the subject matter described can be implemented as a method. A polycrystalline diamond is affixed to a substrate to form a PDC cutter for a tool. The polycrystalline diamond has a cross-sectional dimension of at least 4 millimeters. The substrate includes tungsten carbide. An outer surface of the PDC cutter is at least partially surrounded with a single layer of coating by atomic layer deposition. The single layer of coating is configured to protect the PDC cutter from thermal degradation in response to exposure to a temperature greater than 700° C. and less than about 1050° C.

This, and other aspects, can include one or more of the following features. Affixing the polycrystalline diamond to the substrate can include placing the polycrystalline diamond in contact with a powder form of the substrate. The polycrystalline diamond can be synthesized from diamond powder with a particle size within a range of from about 0.1 µm to about 50 µm. Affixing the polycrystalline diamond to the substrate can include sintering the powder form of the substrate into a rigid material while also bonding the substrate to the polycrystalline diamond. In some implementations, the powder form of the substrate includes a WC-Co powder having a Co content within a range of from about 1% to about 20% by weight. In some implementations, the WC-Co powder has an average particle size within a range of from about 1 nm to about 50 µm. At least partially surrounding the outer surface of the PDC cutter with the single layer of coating includes depositing the single layer of coating on top of at least a portion of the outer surface of the PDC cutter by atomic layer deposition performed at a temperature in a range of from about 200° C. to about 400° C. In some implementations, the single layer of coating has a thickness in a range of from 1 nm to 100 nm. The entire outer surface of the PDC cutter can be completely encapsulated by the single layer of coating. In some implementations, the single layer of coating includes aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

Certain aspects of the subject matter described can be implemented as a method. A polycrystalline diamond is affixed to a substrate to form a PDC cutter for a tool. The polycrystalline diamond has a cross-sectional dimension of at least 4 millimeters. The substrate includes tungsten carbide. An outer surface of the PDC cutter is at least partially surrounded by multiple layers of coating by atomic layer deposition. The multiple layers of coating are configured to protect the PDC cutter from thermal degradation in response to exposure to a temperature greater than 700° C. and less than about 1050° C.

This, and other aspects, can include one or more of the following features. Affixing the polycrystalline diamond to the substrate can include placing the polycrystalline diamond in contact with a powder form of the substrate. The polycrystalline diamond can be synthesized from diamond powder with a particle size within a range of from about 0.1 µm to about 50 µm. Affixing the crystalline diamond to the substrate can include sintering the powder form of the substrate into a rigid material while also bonding the substrate to the polycrystalline diamond. In some implementations, the powder form of the substrate includes a WC-Co powder having a Co content within a range of from about 1% to about 20% by weight. In some implementations, the WC-Co powder has an average particle size within a range of from about 1 nm to about 50 µm. At least partially surrounding the outer surface of the PDC cutter with the multiple layers of coating can include depositing the multiple layers of coating on top of at least a portion of the outer surface of the PDC cutter by atomic layer deposition performed at a temperature in a range of from about 200° C. to about 400° C. Each of the layers of coating can be deposited layer by layer via atomic layer deposition. In some implementations, the multiple layers of coating have an overall thickness in a range of from 1 nm to 100 nm. In some implementations, each layer of the multiple layers of coating has a thickness in a range of from 1 nm to 100 nm. The entire outer surface of the PDC cutter can be completely encapsulated by the multiple layers of coating. Each layer of the multiple layers of coating can include at least one of aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

The details of one or more implementations of the subject matter of this disclosure are set forth in the accompanying drawings and the description. Other features, aspects, and advantages of the subject matter will become apparent from the description, the drawings, and the claims.

DETAILED DESCRIPTION

This present disclosure relates to the manufacture of polycrystalline diamond compact (PDC) cutters for use in, for example, oil and gas wellbore formations. The polycrystalline diamond materials are formed and coated to form coated PDC cutters. The coated PDC cutters provide superior abrasive wear, impact damage, and thermal fatigue, thereby overcoming the deficiencies of current polycrystalline diamond materials. The coatings of the present disclosure can protect the polycrystalline diamond material from physical wear and thermal degradation. As a result, the coated PDC cutters of the present disclosure provides increased tool performance, improved tool life, and improved cutting efficiency. For example, the coatings of the disclosed PDC cutters can be included in, for example, drill bits, hybrid drill bits, reamers, mill heads, electric submersible pumps, downhole bearings (such as mud motor system), and/or other downhole tools, in which enhanced physical characteristics (such as improved resistance to abrasive wear, impact damage, and thermal fatigue) are desired.

Figure 1:
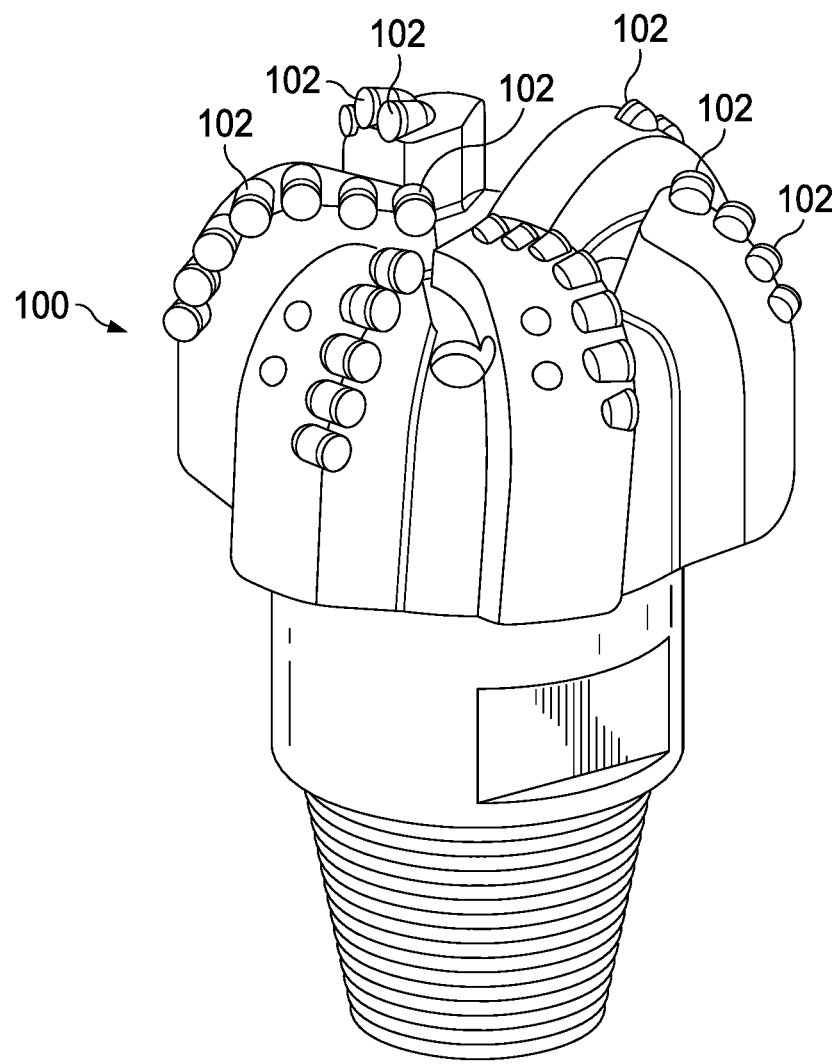
FIG. 1 is a perspective view of an example drill bit used in the oil and gas industry for forming a wellbore.

FIG. 1 is a perspective view of an example drill bit 100 used in the oil and gas industry for forming a wellbore. The drill bit 100 includes a plurality of PDC cutters 102. The PDC cutters 102 operate to cut into rock to form a wellbore. In some implementations, the PDC cutters 102 are synthesized using a catalyst, such as a catalyst based from cobalt, nickel, a Group VIII metal (for example, iron, ruthenium, osmium, and hassium) or any of their alloys, aluminum, titanium, chromium, manganese, tantalum, nickel aluminide ($Ni_3Al$), or boron-containing nickel aluminide. In some implementations, the PDC cutters 102 are synthesized free of a catalyst—that is, the PDC cutters 102 can be synthesized without the use of a catalyst. As previously stated, the PDC cutters 102 can be used in other tools without departing from the scope of the disclosure.

Figure 2:
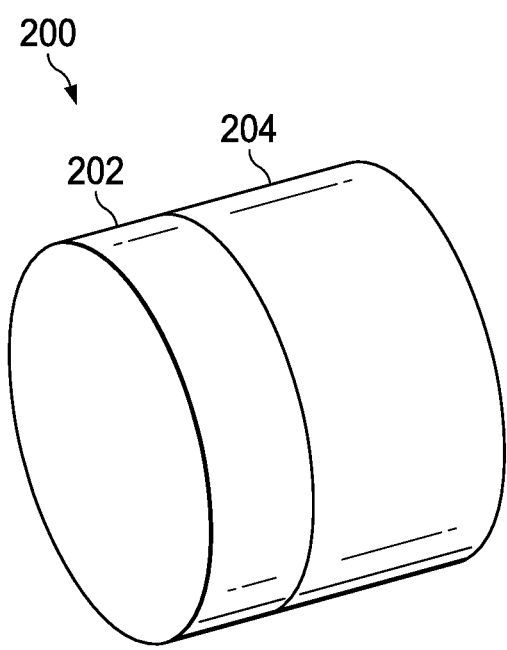
FIG. 2 is a perspective view of an example PDC cutter.

FIG. 2 is a perspective view of an example PDC cutter 200. For example, one or more of the PDC cutters 102 of drill bit 100 shown in FIG. 1 can be implementations of the PDC cutter 200 shown in FIG. 2. In some implementations, the PDC cutter 200 is disc-shaped. The PDC cutter 200 includes a polycrystalline diamond layer 202 (also referred to as a diamond table) and a substrate 204. In some implementations, the polycrystalline diamond layer 202 has a thickness within a range of from 2 millimeters (mm) to 4 mm. In some implementations, the polycrystalline diamond layer 202 has a thickness greater than 4 mm or less than 2 mm. In some implementations, the substrate 204 is formed from a mixture of tungsten carbide (WC) and cobalt (Co). In some implementations, cobalt may form 1% to 20% by weight of the WC-Co mixture. In some implementations, the substrate 204 is formed from WC and Co by sintering-hot isostatic pressing (sintering-HIP), and then the polycrystalline diamond layer 202 is formed on top of the substrate 204 by high pressure, high temperature (HPHT) technology, which can include the infiltration of Co from the substrate 204 into the polycrystalline diamond layer 202. In some implementations, the substrate 204 is formed from a powder during manufacturing of the PDC cutter 200. In some implementations, the substrate 204 has a thickness within a range of from 9 mm to 11 mm. In some implementations, the substrate 204 has a thickness greater than 11 mm or less than 9 mm.

In the illustrated example of FIG. 2, the PDC cutter 200 has a circular cross-sectional shape. A cross-sectional dimension (for example, diameter) D of the PDC cutter 200 may vary according to a desired size of the PDC cutter 200. In some implementations, the PDC cutter 200 has a cross-sectional dimension D within a range of from 4 mm to 48 mm. In some implementations, the cross-sectional dimension D of the PDC cutter 200 is greater than 48 mm or less than 4 mm. As shown in FIG. 2, the PDC cutter 200 can have a cylindrical shape. In some implementations, a cross-sectional size of the polycrystalline diamond layer 202 is different from a cross-sectional size of the substrate 204. In some implementations, the cross-sectional shape of the PDC cutter 200 may be other than circular. In some implementations, the PDC cutter 200 has a non-circular cross-sectional shape. For example, the PDC cutter 200 may be oval, square, rectangular, or have an irregular shape. The cross-sectional dimension of the PDC cutter 200 may be within a range of from 4 mm to 48 mm. In some implementations, the polycrystalline diamond layer 202 has a non-planar surface. For example, a top surface of the polycrystalline diamond layer 202 can be oval, chiseled, axe-bladed, or sharp-pointed.

Figure 3A:
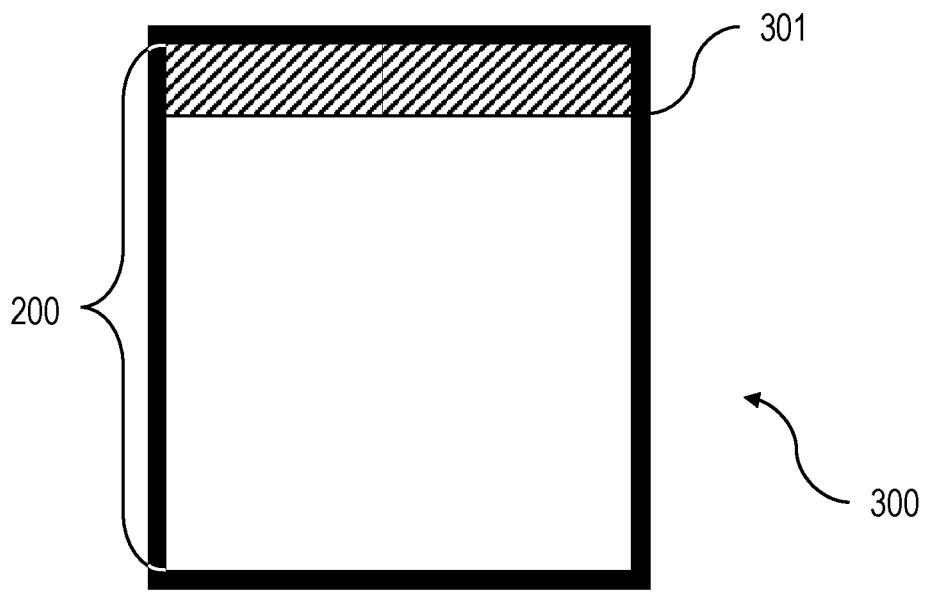
FIG. 3A is a cross-sectional view of the example PDC cutter of FIG. 2 fully coated.

FIG. 3A is a cross-sectional view of a fully coated PDC cutter 300. One or more of the PDC cutters 102 of drill bit 100 shown in FIG. 1 can be implementations of the PDC cutter 300 shown in FIG. 3A. The PDC cutter 300 can be, for example, an implementation of the PDC cutter 200 that is fully coated by a single layer of coating 301. The coating 301 is configured to provide a layer of protection for the PDC cutter 200. The coating 301 is configured to protect the PDC cutter 200 from thermal degradation in response to exposure to a temperature greater than 700 degrees Celsius (° C.) and less than about 1050° C. In some implementations, the coating 301 is configured to protect the PDC cutter 200 from thermal degradation in response to exposure to a temperature greater than 850° C. and less than about 1050° C. The coating 301 can be made of an oxide, a nitride, a sulfide, or another material. Some non-limiting examples of suitable oxides for the coating 301 include aluminum oxide ($Al_2O_3$), silicon oxide ($SiO_2$), zirconium oxide ($Zr_2O$), zinc oxide (ZnO), cesium oxide ($CeO_2$), and aluminum-doped ZnO. Some non-limiting examples of suitable nitrides for the coating 301 include titanium nitride (TiN), zirconium nitride (ZrN), and tantalum nitride (TaN). Some non-limiting examples of suitable sulfides for the coating 301 include zinc sulfide (ZnS) and molybdenum sulfide ($MoS_2$).

As shown in FIG. 3A, the single layer of coating 301 fully encapsulates the PDC cutter 200. In some implementations, the single layer of coating 301 has a thickness in a range of from 1 nanometer (nm) to 100 nm. In some implementations, the single layer of coating 301 has a thickness in a range of from 10 nm to 50 nm. In some implementations, the single layer of coating 301 has a thickness in a range of from 20 nm to 30 nm.

Figure 3B:
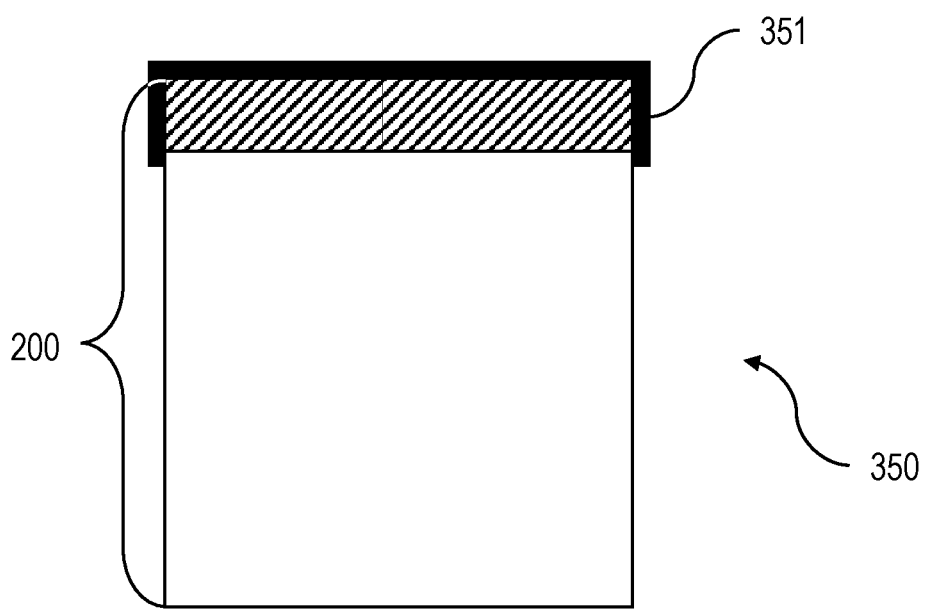
FIG. 3B is a cross-sectional view of the example PDC cutter of FIG. 2 partially coated.

FIG. 3B is a cross-sectional view of a partially coated PDC cutter 350. One or more of the PDC cutters 102 of drill bit 100 shown in FIG. 1 can be implementations of the PDC cutter 350 shown in FIG. 3B. The PDC cutter 350 can be, for example, an implementation of the PDC cutter 200 that is partially coated by a single layer of coating 351. The coating 351 is configured to provide a layer of protection for the PDC cutter 200. As shown in FIG. 3B, the coating 351 partially coats the outer surface of the PDC cutter 200. In some implementations, the coating 351 completely covers at least the polycrystalline diamond layer 202 of the PDC cutter 200, such that none of the outer surface of the polycrystalline diamond layer 202 is left exposed. The coating 351 is configured to protect the polycrystalline diamond layer 202 of the PDC cutter 200 from thermal degradation in response to exposure to a temperature greater than 700 degrees Celsius (° C.) and less than about 1050° C. In some implementations, the coating 351 is configured to protect the polycrystalline diamond layer 202 of the PDC cutter 200 from thermal degradation in response to exposure to a temperature greater than 850° C. and less than about 1050° C. The coating 351 can be substantially the same as the coating 301. For example, the coating 351 can be made from the same material as the coating 301. In some implementations, the single layer of coating 351 has a thickness in a range of from 1 nm to 100 nm. In some implementations, the single layer of coating 351 has a thickness in a range of from 10 nm to 50 nm. In some implementations, the single layer of coating 351 has a thickness in a range of from 20 nm to 30 nm.

Figure 4A:
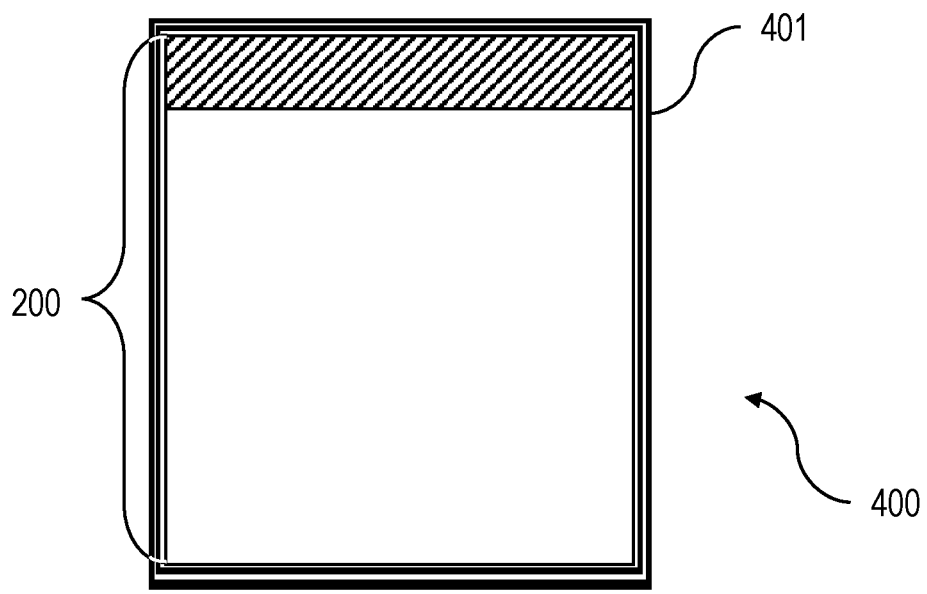
FIG. 4A is a cross-sectional view of the example PDC cutter of FIG. 2 fully coated with multiple layers of coating.

FIG. 4A is a cross-sectional view of a fully coated PDC cutter 400. One or more of the PDC cutters 102 of drill bit 100 shown in FIG. 1 can be implementations of the PDC cutter 400 shown in FIG. 4A. The PDC cutter 400 can be, for example, an implementation of the PDC cutter 200 that is fully coated by multiple layers of coating 401. The multiple layers of coating 401 are configured to provide protection for the PDC cutter 200. The multiple layers of coating 401 are configured to protect the PDC cutter 200 from thermal degradation in response to exposure to a temperature greater than 700 degrees Celsius (° C.) and less than about 1050° C. In some implementations, the multiple layers of coating 401 are configured to protect the PDC cutter 200 from thermal degradation in response to exposure to a temperature greater than 850° C. and less than about 1050° C.

The multiple layers of coating 401 can be substantially the same as the coating 301. For example, each of the layers of coating 401 can be made of an oxide, a nitride, a sulfide, or another material. Some non-limiting examples of suitable oxides for the multiple layers of coating 401 include aluminum oxide ($Al_2O_3$), silicon oxide ($SiO_2$), zirconium oxide ($Zr_2O$), zinc oxide (ZnO), cesium oxide ($CeO_2$), and aluminum-doped ZnO. Some non-limiting examples of suitable nitrides for multiple layers of coating 401 include titanium nitride (TiN), zirconium nitride (ZrN), and tantalum nitride (TaN). Some non-limiting examples of suitable sulfides for the multiple layers of coating 401 include zinc sulfide (ZnS) and molybdenum sulfide ($MoS_2$). In some implementations, every layer of the multiple layers of coating 401 are made of the same material. In some implementations, the multiple layers of coating 401 can include layers made from different materials. For example, the multiple layers of coating 401 can be made of alternating layers of a first material and a second material. For example, the multiple layers of coating 401 can be made of a combination of materials layered in a desired order.

In some implementations, the multiple layers of coating 401 altogether have a thickness in a range of from 1 nm to 100 nm. In some implementations, the multiple layers of coating 401 altogether have a thickness in a range of from 10 nm to 50 nm. In some implementations, the multiple layers of coating 401 altogether have a thickness in a range of from 20 nm to 30 nm. In some implementations, each of the layers of coating 401 separately have a thickness in a range of from 1 nm to 100 nm. In some implementations, each of the layers of coating 401 separately have a thickness in a range of from 10 nm to 50 nm. In some implementations, each of the layers of coating 401 separately have a thickness in a range of from 20 nm to 30 nm.

Figure 4B:
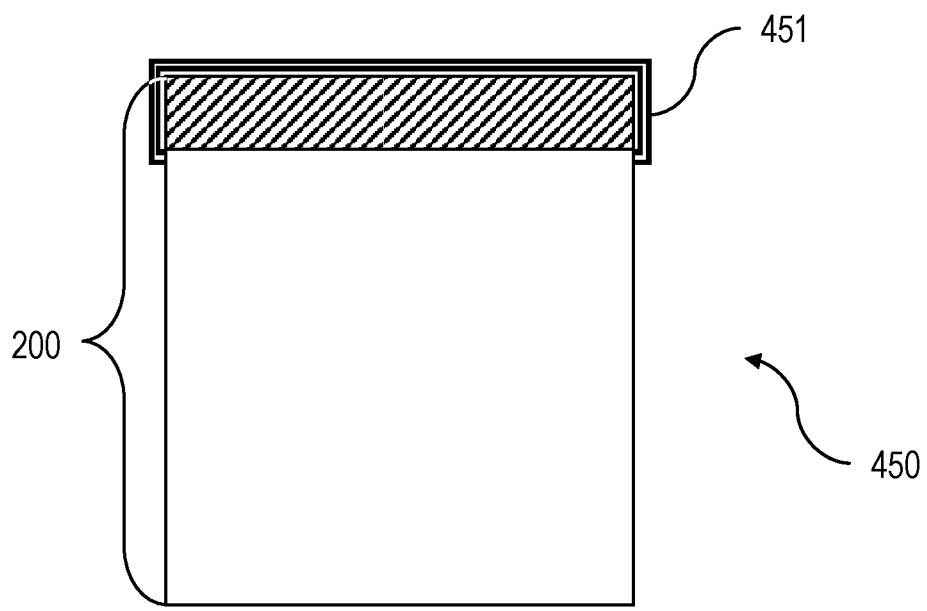
FIG. 4B is a cross-sectional view of the example PDC cutter of FIG. 2 partially coated with multiple layers of coating.

FIG. 4B is a cross-sectional view of a partially coated PDC cutter 450. One or more of the PDC cutters 102 of drill bit 100 shown in FIG. 1 can be implementations of the PDC cutter 450 shown in FIG. 4B. The PDC cutter 450 can be, for example, an implementation of the PDC cutter 200 that is partially coated by multiple layers of coating 451. The multiple layers of coating 451 is configured to provide protection for the PDC cutter 200. As shown in FIG. 4B, the multiple layers of coating 451 partially coats the outer surface of the PDC cutter 200. In some implementations, the multiple layers of coating 451 completely covers at least the polycrystalline diamond layer 202 of the PDC cutter 200, such that none of the outer surface of the polycrystalline diamond layer 202 is left exposed. The multiple layers of coating 451 is configured to protect the polycrystalline diamond layer 202 of the PDC cutter 200 from thermal degradation in response to exposure to a temperature greater than 700 degrees Celsius (° C.) and less than about 1050° C. In some implementations, the multiple layers of coating 451 is configured to protect the polycrystalline diamond layer 202 of the PDC cutter 200 from thermal degradation in response to exposure to a temperature greater than 850° C. and less than about 1050° C.

The multiple layers of coating 451 can be substantially the same as the multiple layers of coating 401. For example, the multiple layers of coating 451 can be made from the same material as the multiple layers of coating 401. In some implementations, every layer of the multiple layers of coating 451 are made of the same material. In some implementations, the multiple layers of coating 451 can include layers made from different materials. For example, the multiple layers of coating 451 can be made of alternating layers of a first material and a second material. For example, the multiple layers of coating 451 can be made of a combination of materials layered in a desired order.

In some implementations, the multiple layers of coating 451 altogether have a thickness in a range of from 1 nm to 100 nm. In some implementations, the multiple layers of coating 451 altogether have a thickness in a range of from 10 nm to 50 nm. In some implementations, the multiple layers of coating 451 altogether have a thickness in a range of from 20 nm to 30 nm. In some implementations, each of the layers of coating 451 separately have a thickness in a range of from 1 nm to 100 nm. In some implementations, each of the layers of coating 451 separately have a thickness in a range of from 10 nm to 50 nm. In some implementations, each of the layers of coating 451 separately have a thickness in a range of from 20 nm to 30 nm.

Figure 5:
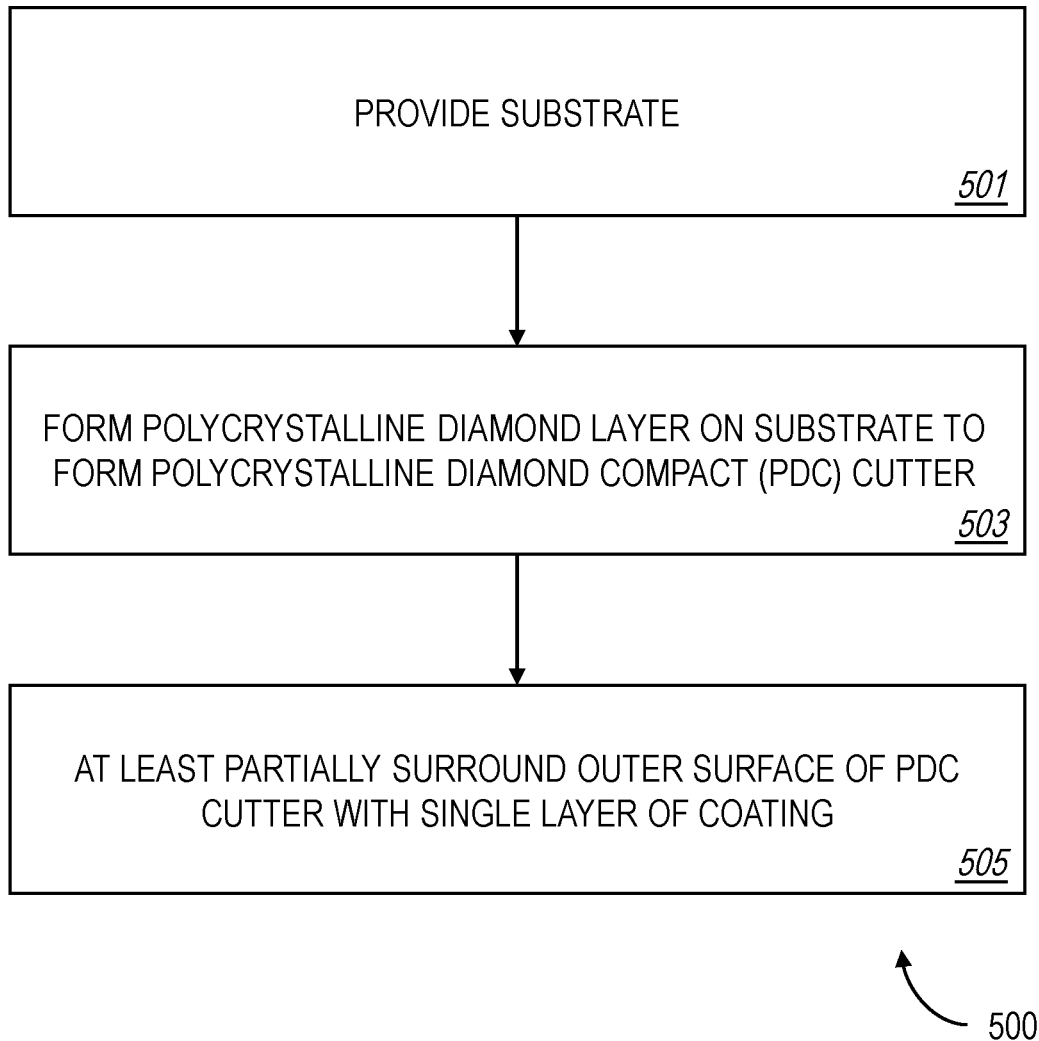
FIG. 5 is a flow chart of an example method for forming a PDC cutter.

FIG. 5 is a flow chart of a method 500 for forming a PDC cutter, for example, the coated PDC cutter 300 or partially coated PDC cutter 350 shown in FIG. 3A or 3B, respectively. At block 501, a substrate (such as the substrate 204) is provided. The substrate 204 provided at block 501 includes tungsten carbide.

At block 503, a polycrystalline diamond layer (such as the polycrystalline diamond 202) is formed on the substrate 204 (provided at block 501) to form a PDC cutter (such as the PDC cutter 200) for a tool (such as the drill bit 100). The polycrystalline diamond layer 202 formed at block 503 has a cross-sectional dimension of at least 4 millimeters. In some implementations, forming the polycrystalline diamond layer 202 on the substrate 204 at block 503 includes placing a powder on the substrate 204 by HPHT hot pressing. The powder can include at least one of polycrystalline diamond powder or graphite powder. In some implementations, the powder has a particle size within a range of from about 0.1 µm to about 50 µm. In some implementations, forming the polycrystalline diamond layer 202 on the substrate 204 at block 503 includes sintering the powder into the substrate 204, which is a rigid substrate material, while also bonding the polycrystalline diamond layer 202 to the rigid substrate material. In some implementations, the substrate 204 is pre-formed and includes a WC-Co powder having a Co content within a range of from about 1% to about 20% by weight. In some implementations, the WC-Co powder has an average particle size within a range of about 1 nm to about 50 µm.

At block 505, an outer surface of the PDC cutter 200 is at least partially surrounded with a single layer of coating by atomic layer deposition. The coating is configured to protect the PDC cutter 200 from thermal degradation in response to exposure to a temperature greater than 700° C. and less than about 1050° C. In some implementations, the entire outer surface of the PDC cutter 200 is covered by the single layer of coating at block 505 (an example is the PDC cutter 300 shown in FIG. 3A). For example, in the PDC cutter 300 shown in FIG. 3A, the PDC cutter 200 is completely encapsulated by the single layer of coating 301. In some implementations, only a portion of the outer surface of the PDC cutter 200 is covered by the single layer of coating at block 505 (an example is the PDC cutter 350 shown in FIG. 3B).

The outer surface of the PDC cutter 200 can be at least partially surrounded with the single layer of coating by atomic layer deposition at block 505 by depositing the single layer of coating on top of at least a portion of the outer surface of the PDC cutter 200 by atomic layer deposition. The atomic layer deposition can be performed at a temperature in a range of from about 200° C. to about 400° C. Atomic layer deposition is a thin-film deposition process that includes pulsed introduction of gaseous reactants. A chemical reaction occurs on a surface and the single layer of coating is deposited uniformly across the topography of the surface. Atomic layer deposition can be implemented independent of a line of sight, such that even convoluted/ complicated surfaces can be coated by the single layer of coating via atomic layer deposition. Atomic layer deposition can provide precise thickness control on the order of Angstroms to minimize inherent stress. The thickness of the coating can be controlled by adjusting the number of cycles and durations of the pulsed introduction of the gaseous reactants. Another advantage of atomic layer deposition is that the coating layer can be fully dense without defects from de-bonding or cracking. The PDC cutter 200 is configured to withstand the temperatures associated with atomic layer deposition (for example, temperatures in a range of from about 200° C. to about 400° C.), so there is no expected risk of thermal degradation of the PDC cutter 200 throughout the atomic layer deposition process.

In some implementations, the single layer of coating has a thickness in a range of from 1 nm to 100 nm, from 10 nm to 50 nm, or from 20 nm to 30 nm. In some implementations, the single layer of coating comprises aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

Figure 6:
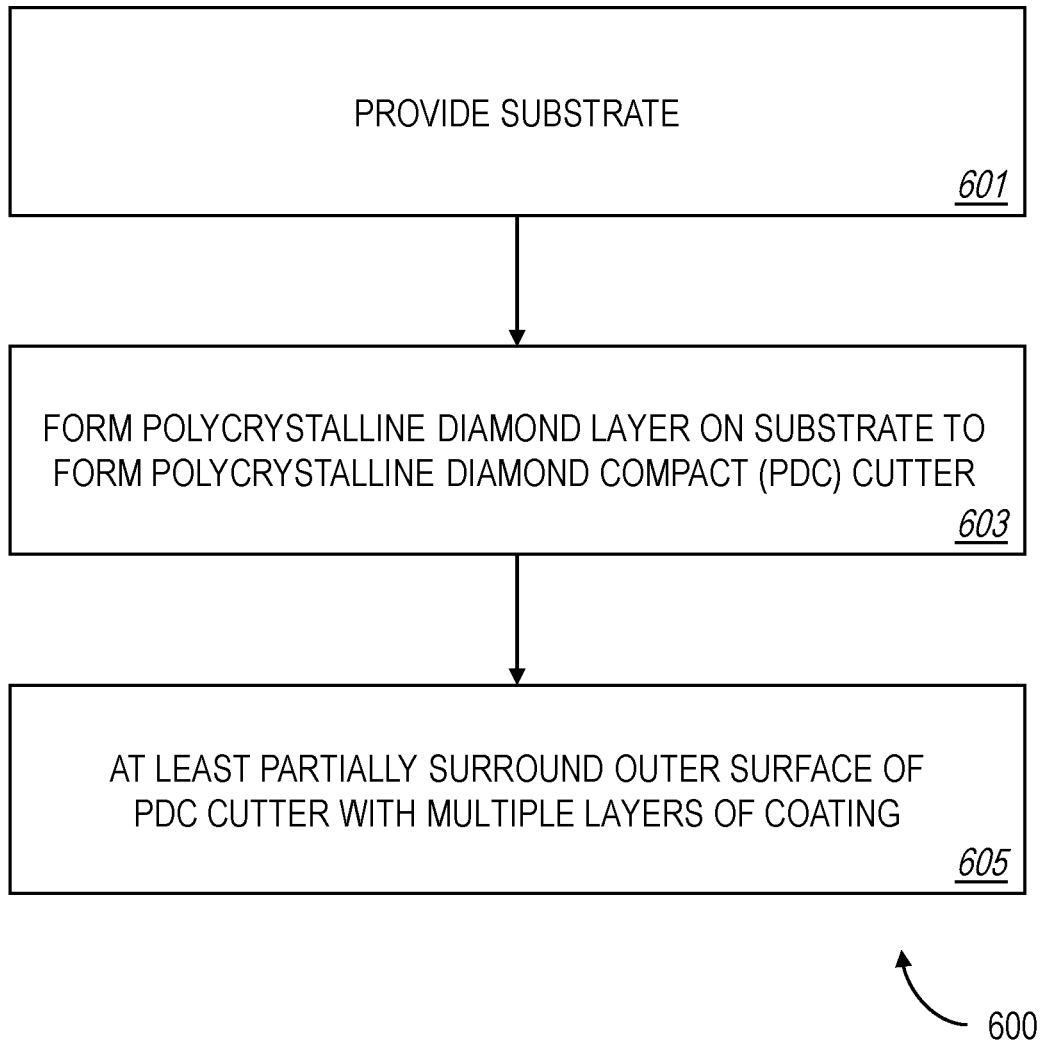
FIG. 6 is a flow chart of an example method for forming a PDC cutter.

FIG. 6 is a flow chart of a method 600 for forming a PDC cutter, for example, the coated PDC cutter 400 or partially coated PDC cutter 450 shown in FIG. 4A or 4B, respectively. At block 601, a substrate (such as the substrate 204) is provided. The substrate 204 provided at block 601 includes tungsten carbide.

At block 603, a polycrystalline diamond layer (such as the polycrystalline diamond 202) is formed on the substrate 204 (provided at block 601) to form a PDC cutter (such as the PDC cutter 200) for a tool (such as the drill bit 100). The polycrystalline diamond layer 202 formed at block 603 has a cross-sectional dimension of at least 4 millimeters. In some implementations, forming the polycrystalline diamond layer 202 on the substrate 204 at block 603 includes placing a powder on the substrate 204 by HPHT hot pressing. The powder can include at least one of polycrystalline diamond powder or graphite powder. In some implementations, the powder has a particle size within a range of from about 0.1 µm to about 50 µm. In some implementations, forming the polycrystalline diamond layer 202 on the substrate 204 at block 603 includes sintering the powder into the substrate 204, which is a rigid substrate material, while also bonding the polycrystalline diamond layer 202 to the rigid substrate material. In some implementations, the substrate 204 is pre-formed and includes a WC-Co powder having a Co content within a range of from about 1% to about 20% by weight. In some implementations, the WC-Co powder has an average particle size within a range of about 1 nm to about 50 µm.

At block 605, an outer surface of the PDC cutter 200 is at least partially surrounded with multiple layers of coating by atomic layer deposition. The multiple layers of coating are configured to protect the PDC cutter 200 from thermal degradation in response to exposure to a temperature greater than 700° C. and less than about 1050° C. In some implementations, the entire outer surface of the PDC cutter 200 is covered by the multiple layers of coating at block 605 (an example is the PDC cutter 400 shown in FIG. 4A). For example, in the PDC cutter 400 shown in FIG. 4A, the PDC cutter 200 is completely encapsulated by the multiple layers of coating 401. In some implementations, only a portion of the outer surface of the PDC cutter 200 is covered by the multiple layers of coating at block 605 (an example is the PDC cutter 450 shown in FIG. 4B).

The outer surface of the PDC cutter 200 can be at least partially surrounded with the multiple layers of coating by atomic layer deposition at block 605 by depositing the multiple layers of coating on top of at least a portion of the outer surface of the PDC cutter 200 by atomic layer deposition. The atomic layer deposition can be performed at a temperature in a range of from about 200° C. to about 400° C. The PDC cutter 200 is configured to withstand the temperatures associated with atomic layer deposition (for example, temperatures in a range of from about 200° C. to about 400° C.), so there is no expected risk of thermal degradation of the PDC cutter 200 throughout the atomic layer deposition process.

In some implementations, the multiple layers of coating altogether has a thickness in a range of from 1 nm to 100 nm, from 10 nm to 50 nm, or from 20 nm to 30 nm. In some implementations, each of the layers of the coating have a thickness in a range of from 1 nm to 100 nm, from 10 nm to 50 nm, or from 20 nm to 30 nm. In some implementations, each of the layers of the coating includes aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$). In some implementations, each of the layers of the coating are made of the same material. In some implementations, the material from which the layers of the coating are made can vary.

Figure 7:
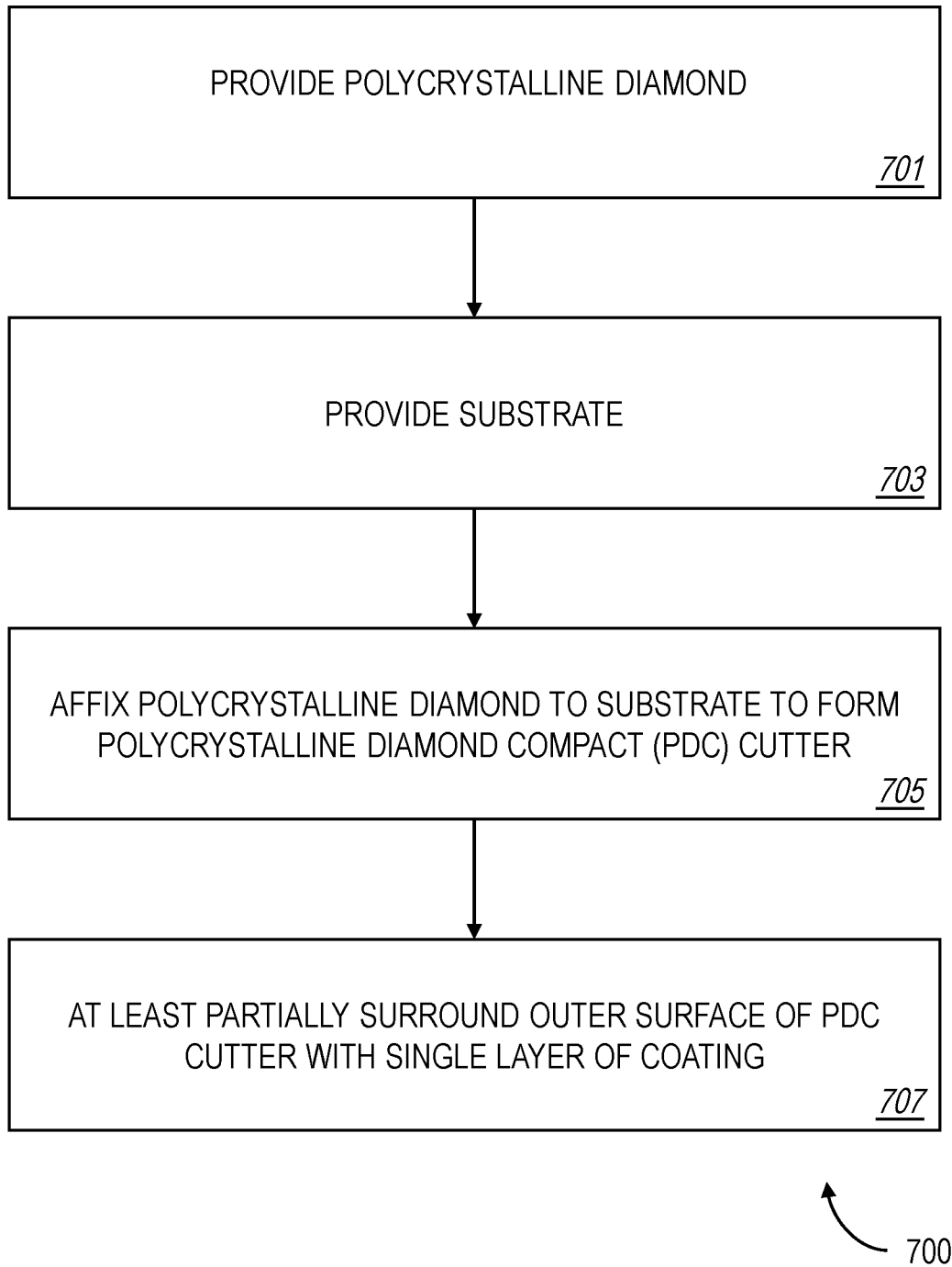
FIG. 7 is a flow chart of an example method for forming a PDC cutter.

FIG. 7 is a flow chart of a method 700 for forming a PDC cutter, for example, the coated PDC cutter 300 or partially coated PDC cutter 350 shown in FIG. 3A or 3B, respectively. At block 701, a polycrystalline diamond (such as the polycrystalline diamond layer 202) is provided. The polycrystalline diamond 202 provided at block 701 has a cross-sectional dimension of at least 4 millimeters. In some implementations, providing the polycrystalline diamond 202 at block 701 includes synthesizing the polycrystalline diamond 202 from diamond powder with a particle size within a range of from about 0.1 µm to about 50 µm. At block 703, a substrate (such as the substrate 204) is provided. The substrate 204 provided at block 703 includes tungsten carbide.

At block 705, the polycrystalline diamond 202 (provided at block 701) is affixed to the substrate 204 (provided at block 703) to form a PDC cutter (such as the PDC cutter 200) for a tool (such as the drill bit 100). In some implementations, affixing the polycrystalline diamond 202 to the substrate 204 at block 705 includes placing the polycrystalline diamond 202 in contact with a powder form of the substrate 204. In some implementations, affixing the polycrystalline diamond 202 to the substrate 204 at block 705 includes sintering the powder form of the substrate 204 into a rigid material while also bonding the substrate 204 to the polycrystalline diamond 202. In some implementations, the powder form of the substrate 204 includes a WC-Co powder having a Co content within a range of from about 1% to about 20% by weight. In some implementations, the WC-Co powder has an average particle size within a range of about 1 nm to about 50 µm.

At block 707, an outer surface of the PDC cutter 200 is at least partially surrounded with a single layer of coating. The coating is configured to protect the PDC cutter 200 from thermal degradation in response to exposure to a temperature greater than 700° C. and less than about 1050° C. In some implementations, the entire outer surface of the PDC cutter 200 is covered by the single layer of coating at block 707 (an example is the PDC cutter 300 shown in FIG. 3A). For example, in the PDC cutter 300 shown in FIG. 3A, the PDC cutter 200 is completely encapsulated by the single layer of coating 301. In some implementations, only a portion of the outer surface of the PDC cutter 200 is covered by the single layer of coating at block 707 (an example is the PDC cutter 350 shown in FIG. 3B).

The outer surface of the PDC cutter 200 can be at least partially surrounded with the single layer of coating at block 707 by depositing the single layer of coating on top of at least a portion of the outer surface of the PDC cutter 200 by atomic layer deposition. The atomic layer deposition can be performed at a temperature in a range of from about 200° C. to about 400° C. The PDC cutter 200 is configured to withstand the temperatures associated with atomic layer deposition (for example, temperatures in a range of from about 200° C. to about 400° C.), so there is no expected risk of thermal degradation of the PDC cutter 200 throughout the atomic layer deposition process.

In some implementations, the single layer of coating has a thickness in a range of from 1 nm to 100 nm, from 10 nm to 50 nm, or from 20 nm to 30 nm. In some implementations, the single layer of coating comprises aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

Figure 8:
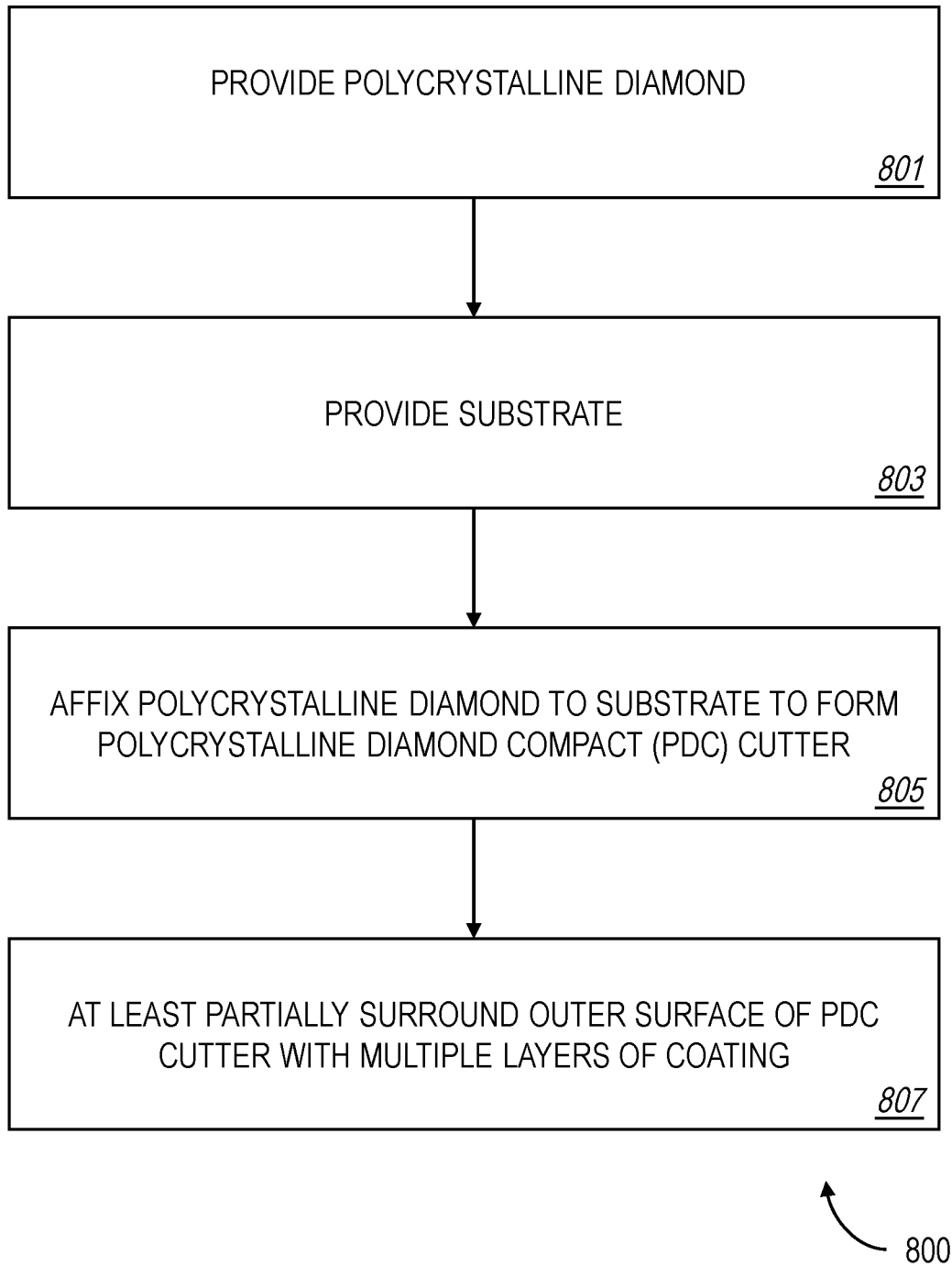
FIG. 8 is a flow chart of an example method for forming a PDC cutter.

FIG. 8 is a flow chart of a method 800 for forming a PDC cutter, for example, the coated PDC cutter 400 or partially coated PDC cutter 450 shown in FIG. 4A or 4B, respectively. At block 801, a polycrystalline diamond (such as the polycrystalline diamond layer 202) is provided. The polycrystalline diamond 202 provided at block 801 has a cross-sectional dimension of at least 4 millimeters. In some implementations, providing the polycrystalline diamond 202 at block 801 includes synthesizing the polycrystalline diamond 202 from diamond powder with a particle size within a range of from about 0.1 μm to about 50 μm. At block 803, a substrate (such as the substrate 204) is provided. The substrate 204 provided at block 803 includes tungsten carbide.

At block 805, the polycrystalline diamond 202 (provided at block 801) is affixed to the substrate 204 (provided at block 803) to form a PDC cutter (such as the PDC cutter 200) for a tool (such as the drill bit 100). In some implementations, affixing the polycrystalline diamond 202 to the substrate 204 at block 805 includes placing the polycrystalline diamond 202 in contact with a powder form of the substrate 204. In some implementations, affixing the polycrystalline diamond 202 to the substrate 204 at block 805 includes sintering the powder form of the substrate 204 into a rigid material while also bonding the substrate 204 to the polycrystalline diamond 202. In some implementations, the powder form of the substrate 204 includes a WC-Co powder having a Co content within a range of from about 1% to about 20% by weight. In some implementations, the WC-Co powder has an average particle size within a range of about 1 nm to about 50 μm.

At block 807, an outer surface of the PDC cutter 200 is at least partially surrounded with multiple layers of coating. The multiple layers of coating are configured to protect the PDC cutter 200 from thermal degradation in response to exposure to a temperature greater than 700° C. and less than about 1050° C. In some implementations, the entire outer surface of the PDC cutter 200 is covered by the multiple layers of coating at block 807 (an example is the PDC cutter 400 shown in FIG. 4A). For example, in the PDC cutter 400 shown in FIG. 4A, the PDC cutter 200 is completely encapsulated by the multiple layers of coating 401. In some implementations, only a portion of the outer surface of the PDC cutter 200 is covered by the multiple layers of coating at block 807 (an example is the PDC cutter 450 shown in FIG. 4B).

The outer surface of the PDC cutter 200 can be at least partially surrounded with the multiple layers of coating at block 807 by depositing the multiple layers of coating on top of at least a portion of the outer surface of the PDC cutter 200 by atomic layer deposition. The atomic layer deposition can be performed at a temperature in a range of from about 200° C. to about 400° C. The PDC cutter 200 is configured to withstand the temperatures associated with atomic layer deposition (for example, temperatures in a range of from about 200° C. to about 400° C.), so there is no expected risk of thermal degradation of the PDC cutter 200 throughout the atomic layer deposition process.

In some implementations, the multiple layers of coating altogether has a thickness in a range of from 1 nm to 100 nm, from 10 nm to 50 nm, or from 20 nm to 30 nm. In some implementations, each of the layers of the coating have a thickness in a range of from 1 nm to 100 nm, from 10 nm to 50 nm, or from 20 nm to 30 nm. In some implementations, each of the layers of the coating includes aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$). In some implementations, each of the layers of the coating are made of the same material. In some implementations, the material from which the layers of the coating are made can vary.

The PDC cutters 102 can be formed from a polycrystalline diamond material formed using HPHT technology or ultra-high pressure, high temperature (UHPHT) technology. UHPHT technology can involve forming the polycrystalline diamond material using compressive pressures within a range of 10 gigapascals (GPa) to 35 GPa and temperatures within a range of 2000 Kelvin (K) to 3000 K. The UHPHT methods cause the diamond powder to form a polycrystalline form. The UHPHT systems and methods described in the present disclosure can exclude the use of a catalyst to promote sintering and the formation of polycrystalline diamond. The polycrystalline diamond material formed using traditional methods are formed at lower pressures and require the use of a catalyst, such as cobalt, to promote sintering and the formation of the polycrystalline diamond. However, during drilling, the catalyst heats and expands, damaging bonding between the polycrystalline diamond and the underlying substrate, causing separation of the polycrystalline diamond individual grains within the diamond table and as well the interface from the substrate and, hence, the drilling bit. As a result, drilling performance is dramatically reduced.

The higher pressures associated with the UHPHT systems and methods of the present disclosure can promote sintering of the diamond particles to form polycrystalline diamond without the use of a catalyst. As a consequence, the polycrystalline diamond material and associated PDC drill bits of the present disclosure do not suffer from the problems experienced by current drill bits containing polycrystalline diamond as a result of the use of a catalyst.

Current PDC cutters range in size between 4 mm and 22 mm. For drilling applications, the minimum diameter of the ultra-strong PDC cutting material should be 4 mm. To form cutters, the synthesized UHPHT polycrystalline diamond material is joined to a substrate, such as a substrate formed from WC-Co. Various forming methods, including vacuum diffusion bonding, hot pressing, spark plasma sintering, microwave joining, or HPHT bonding technology may be used to joining the UHPHT polycrystalline diamond material to the substrate.

Conventionally, the substrate is pre-pressed and diamond is in powder form prior to forming PDC cutter by traditional technologies. In some of the approaches described below, the substrate is in the form of a powder when placed in contact with the polycrystalline diamond material. The pressures and temperatures experienced during the joining method can sinter the substrate material into a rigid material while also bonding the substrate to the UHPHT polycrystalline diamond material to form a PDC cutter, similar to the PDC cutter 102 shown in FIGS. 1 and 2. In some implementations, a starting material of the substrate may be a WC-Co powder having a Co content within a range of one percent to 20 percent by weight. The WC-Co powder may have a particle size within a range of from about 0.1 micrometers (μm) to about 50 μm.

As mentioned above, cutters can be formed with a HPHT (conventional pressures ranging 5-7 GPa) bonding/joining technology using WC/Co powder while bonding to UHPHT catalyst-free polycrystalline diamond cutting materials or disks. Current UHPHT technology can also be applied to join polycrystalline diamond to the substrate in the form of a powder. For other proposed methods such as SPS and HP, we may use solid or pre-pressed WC substrate may be used instead of WC/Co powder to join or bond to the polycrystalline diamond materials. Besides HPHT and UHPHT joining methods, SPS methods may use the substrate in the form of a power due to using mold and its applying pressures higher to 1 GPa.

For vacuum bonding, the polycrystalline diamond material and substrate material are placed under a vacuum within a range of $10^{-2}$ Torr to $10^{-6}$ Torr, and exposed to bonding temperatures are within a range of 600° C. to 1200° C. Vacuum joining or brazing takes advantage of the "absence of air" in a hot zone environment where braze filler metals can be melted in a non-contaminating environment. In contrast to typical vacuum joining techniques, this approach includes a pressure is applied to the polycrystalline diamond material and substrate material. The applied pressure is in a range of 10 MPa to 1 GPa. These pressures overcome conventional low-vacuum joining bonding strength issues. A filler metal, such as niobium (Nb), molybdenum (Mo), titanium (Ti), or tungsten (W) may be included at an interface between the polycrystalline diamond material and the substrate material in order to promote bonding and to reduce joining temperatures.

In some implementations, a hot pressing system includes a chamber into which a polycrystalline diamond material and a substrate material can be placed between pistons. The polycrystalline diamond material and the substrate material can be stacked and define an interface. In some implementations, the pistons are formed of graphite. In some implementations, the substrate material may be in powdered form when introduced into the chamber. In some implementations, the substrate material may be in a compressed form (i.e., already formed into a unitary solid) when introduced into the chamber. The pistons apply a load to the polycrystalline material and substrate material in order to bond the two components together and form a PDC cutter (such as the PDC cutter 100). A filler metal, such as niobium (Nb), molybdenum (Mo), titanium (Ti), or tungsten (W) may be included at the interface between the PCD material and the substrate material in order to promote bonding and to reduce joining temperatures.

In operation, the chamber can be placed under a vacuum with a range of $10^{-2}$ Torr to $10^{-4}$ Torr, and the chamber can be heated to a temperature within a range of 600° C. to 1200° C. Additionally, an inert gas, such as argon (Ar), is introduced into the chamber to prevent atmospheric contamination, such as from $O_2$ or $N_2$, as described earlier. In some implementations, loading applied by the pistons may produce compressive pressures in the range of 10 MPa to 2 GPa.

Conventional hot pressing technologies are capable of generating a maximum compressive pressure of approximately 100 MPa. However, the present disclosure provides for pressures beyond 100 MPa, including pressures up to 2 GPa, with the use of pistons formed from diamond or boron nitride (BN). The hot pressing is carried out under vacuum or inert atmosphere to prevent diamond oxidation and graphitization. It can also apply a pressure to the NPI interface to form better bonding strength.

Spark plasma sintering may also be used to join the polycrystalline diamond material, formed via a UHPHT process, to a substrate. Spark plasma sintering, also known as field assisted sintering or pulsed electric current sintering, involves a pulsed or un-pulsed DC or AC current passed directly through a graphite die or piston used to compress the polycrystalline diamond material and substrate material together. In some instances where the substrate is initially in the form of a powder, the piston is also used to compact the powder. In some implementations, the substrate may be compacted prior to spark plasma sintering. Joule heating (also known as resistive heating) is used to heat the polycrystalline diamond material and substrate material. The pressure applied by the piston and increased temperature achieves a near theoretical density of the substrate at lower sintering temperatures compared to conventional sintering techniques. The heat generated is internal to the polycrystalline diamond and substrate, in contrast to conventional hot pressing, where heat is provided by an external heater. The internal heating can provide higher heating and cooling rates are possible with other sintering methods. As a consequence, sintering occurs more rapidly compared to other sintering methods.

In a trial operation, the polycrystalline diamond material and substrate material were heated to a temperature within a range of 600° C. to 1200° C. within at atmospheric pressure within a range of $10^{-2}$ Torr to $10^{-6}$ Torr. Temperature was increased by passing a pulsed or direct electric current of 1000 amps (A) to 2000 A through the PCD material and substrate material. The current may be applied using a voltage of approximately 10 volts (V). In some implementations, the polycrystalline diamond material and substrate material are heated in a stepwise fashion from ambient room temperature to a desired joining temperature. The low pressure atmosphere may be generated by application of a vacuum to a compartment containing the polycrystalline diamond material and substrate material.

The polycrystalline diamond material and substrate material may be heated at a rate of approximately 1000 K per minute. Heating at this rate reduces stress concentrations. Heating rates of between 10K per minute to 1000K per minute in the low pressure atmosphere described earlier are anticipated to provide the reduced stress concentrations. The rate at which the polycrystallind diamond material and substrate material are cooled may also be approximately 1000 K per minute. These heating and cooling rates reduce stress concentrations and increase bonding strength. Besides inert or vacuum atmosphere, SPS has faster heating rates than other methods to effectively avoid diamond degradation at high bonding temperatures.

Microwave joining may be used to join the polycrystalline diamond material formed via a UHPHT process to a substrate, whether initially in the form of a powder or a compacted material. Microwave energy is applied to the stacked polycrystalline diamond material and substrate material to heat these materials so as to bond the materials and form the PDC cutter 100 for oil and gas drilling. In some implementations, microwave energy is applied to the polycrystalline diamond material and substrate material for 10 minutes, causing the polycrystalline diamond material and substrate material to reach 1200° C. Heating rates within a range of approximately 400° C. per minute to approximately 1000° C. per minute may be used to reduce the stress concentrations at an interface between the polycrystalline diamond material and substrate material as well as to enhance a bond strength between these materials. Microwaves can heat the materials internally, thus greatly shortening the bonding processing time at high temperature to prevent diamond degradation such as oxidization and graphitization.

HPHT sintering technology may also be used to join a polycrystalline diamond formed using a UHPHT process to a substrate material. In some implementations, a binder is included at an interface between the polycrystalline diamond material and the substrate material. In some implementations, the substrate may be in the form of a powder or in a compacted form. A pressure imparted to the polycrystalline diamond material and substrate material pressure includes pressures up to 8 GPa, and temperature applied may be within a range of approximately 1200° C. to approximately 1500° C. Where the substrate material is a powdered form of WC-Co, sintering temperatures can be reduced to approximately 1450° C.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A method comprising:
   forming a polycrystalline diamond layer on a substrate to form a polycrystalline diamond compact (PDC) cutter for a tool, wherein the polycrystalline diamond layer has a cross-sectional dimension of at least 4 millimeters, wherein the substrate comprises tungsten carbide; and
   surrounding the polycrystalline diamond layer and at least a portion of the substrate with at least a single layer of coating by atomic layer deposition, the single layer of coating configured to protect the PDC cutter from thermal degradation in response to exposure to a temperature greater than 700 degrees Celsius (° C.) and less than about 1050° C.

2. The method of claim 1, wherein forming the polycrystalline diamond layer on the substrate comprises placing a powder on the substrate by high pressure, high temperature (HPHT) hot pressing, wherein the powder comprises at least one of polycrystalline diamond powder or graphite powder.

3. The method of claim 2, wherein the powder has a particle size within a range of from about 0.1 micrometers (μm) to about 50 μm.

4. The method of claim 2, wherein forming the polycrystalline diamond layer on the substrate comprises sintering the powder into the substrate, which is a rigid substrate material, while also bonding the polycrystalline diamond layer to the rigid substrate material.

5. The method of claim 4, wherein the substrate comprises a WC-Co powder having a Co content within a range of from about 1% to about 20% by weight.

6. The method of claim 5, wherein the WC-Co powder has an average particle size within a range of from about 1 nanometer to about 50 micrometers (μm).

7. The method of claim 1, wherein at least partially surrounding the outer surface of the PDC cutter with at least the single layer of coating by atomic layer deposition comprises depositing the single layer of coating on top of at least a portion of the outer surface of the PDC cutter by atomic layer deposition performed at a temperature in a range of from about 200° C. to about 400° C.

8. The method of claim 7, wherein the single layer of coating has a thickness in a range of from 1 nanometer (nm) to 100 nm.

9. The method of claim 8, wherein the entire outer surface of the PDC cutter is completely encapsulated by the single layer of coating.

10. The method of claim 8, wherein the single layer of coating comprises aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

11. A method comprising:
affixing a polycrystalline diamond to a substrate to form a polycrystalline diamond compact (PDC) cutter for a tool, wherein the polycrystalline diamond has a cross-sectional dimension of at least 4 millimeters, wherein the substrate comprises tungsten carbide; and
at least partially surrounding an outer surface of the PDC cutter with at least a single layer of coating by atomic layer deposition, the single layer of coating configured to protect the PDC cutter from thermal degradation in response to exposure to a temperature greater than 700 degrees Celsius (° C.) and less than about 1050° C.

12. The method of claim 11, wherein affixing the polycrystalline diamond to the substrate comprises placing the polycrystalline diamond in contact with a powder form of the substrate.

13. The method of claim 12, comprising synthesizing the polycrystalline diamond from diamond powder with a particle size within a range of from about 0.1 micrometers (μm) to about 50 μm.

14. The method of claim 12, wherein affixing the polycrystalline diamond to the substrate comprises sintering the powder form of the substrate into a rigid material while also bonding the substrate to the polycrystalline diamond.

15. The method of claim 14, wherein the powder form of the substrate comprises a WC-Co powder having a Co content within a range of from about 1% to about 20% by weight.

16. The method of claim 15, wherein the WC-Co powder has an average particle size within a range of from about 1 nanometer to about 50 micrometers (μm).

17. The method of claim 11, wherein at least partially surrounding the outer surface of the PDC cutter with at least the single layer of coating by atomic layer deposition comprises depositing the single layer of coating on top of at least a portion of the outer surface of the PDC cutter by atomic layer deposition performed at a temperature in a range of from about 200° C. to about 400° C.

18. The method of claim 17, wherein the single layer of coating has a thickness in a range of from 1 nanometer (nm) to 100 nm.

19. The method of claim 18, wherein the entire outer surface of the PDC cutter is completely encapsulated by the single layer of coating.

20. The method of claim 18, wherein the single layer of coating comprises at least one of aluminum oxide ($Al_2O_3$), silicon oxide ($SiO_2$), zirconium oxide ($Zr_2O$), zinc oxide (ZnO), cesium oxide ($CeO_2$), aluminum-doped ZnO, titanium nitride (TiN), zirconium nitride (ZrN), tantalum nitride (TaN), zinc sulfide (ZnS), or molybdenum sulfide ($MoS_2$).

\* \* \* \* \*